US009870299B2

(12) United States Patent
Palmer et al.

(10) Patent No.: US 9,870,299 B2
(45) Date of Patent: Jan. 16, 2018

(54) LOGIC CIRCUIT FOR THE GATHERING OF TRACE DATA

(71) Applicant: International Business Machines Corporation, Armonk, NY (US)

(72) Inventors: Michael J. Palmer, Winchester (GB); Kelvin Wong, Eastleigh (GB)

(73) Assignee: International Business Machines Corporation, Armonk, NY (US)

( * ) Notice: Subject to any disclaimer, the term of this patent is extended or adjusted under 35 U.S.C. 154(b) by 393 days.

(21) Appl. No.: 14/054,539

(22) Filed: Oct. 15, 2013

(65) Prior Publication Data

US 2014/0108872 A1    Apr. 17, 2014

(30) Foreign Application Priority Data

Oct. 16, 2012 (GB) .................................. 1218550.0

(51) Int. Cl.
*G06F 11/34* (2006.01)
*G06F 11/36* (2006.01)
*G01R 31/317* (2006.01)

(52) U.S. Cl.
CPC .... *G06F 11/3466* (2013.01); *G01R 31/31705* (2013.01); *G06F 11/348* (2013.01); *G06F 11/3636* (2013.01)

(58) Field of Classification Search
CPC ............. G06F 11/3476; G06F 11/3632; G06F 11/3636
See application file for complete search history.

(56) References Cited

U.S. PATENT DOCUMENTS 5,642,479 A * 6/1997 Flynn .................... G06F 11/364
714/45
6,141,636 A * 10/2000 Sarno ...................... G06F 11/25
703/23

(Continued)

OTHER PUBLICATIONS

Jun Qian et al., "Logic BIST Architecture for System-Level Test and Diagnosis", 2009 Asian Test Symposium, 2009, pp. 21-26, IEEE Computer Society.

(Continued)

*Primary Examiner* — Loan L. T. Truong
(74) *Attorney, Agent, or Firm* — Thomas E. Tyson; Gregory K. Goshorn; Greg Goshorn, P.C.

(57) ABSTRACT

A logic circuit comprises a plurality of functional logic units each having an independent clock signal and a trace bus for carrying trace data. A trace gathering logic unit collects trace data from the functional logic units, the trace gathering logic unit having a clock signal independent of the clock signals of the functional logic units and a trace bus for receiving trace data from the functional logic units; multiplexing logic for multiplexing portions of trace data from different functional logic units onto the trace bus of the trace gathering logic unit; and, synchronization logic coupled to the multiplexing logic for communicating trace data from the functional, logic units to the trace gathering logic unit based on the clock signal of the trace gathering logic unit, the synchronization logic comprising detection logic when valid trace data from the functional logic units is available for placing on the trace bus of the trace gathering logic unit, and signaling logic coupled to the detection logic for signaling to the trace gathering logic unit that valid trace data is on the trace bus.

16 Claims, 3 Drawing Sheets

(56) References Cited

U.S. PATENT DOCUMENTS

| | | | | |
|---|---|---|---|---|
| 6,311,303 B1* | 10/2001 | Gates | ............... | G01R 31/3185 |
| | | | | 370/244 |
| 7,080,283 B1* | 7/2006 | Songer | ............... | G06F 11/3636 |
| | | | | 714/30 |
| 7,565,591 B2 | 7/2009 | Dingemanse | | |
| 7,702,055 B2* | 4/2010 | Edgar | ............... | G06F 11/3636 |
| | | | | 375/356 |
| 7,844,849 B2 | 11/2010 | Genden et al. | | |
| 8,933,761 B2* | 1/2015 | Bar-Lev | ............... | H05K 1/0248 |
| | | | | 333/1 |
| 9,021,311 B2* | 4/2015 | Miller | ............... | G06F 11/26 |
| | | | | 714/45 |
| 9,218,258 B2* | 12/2015 | Hopkins | ............... | G06F 11/2205 |
| 9,547,038 B2* | 1/2017 | Natarajan | ............... | G01R 31/31704 |
| 2004/0221201 A1* | 11/2004 | Seroff | ............... | G06F 11/3636 |
| | | | | 714/30 |
| 2005/0281201 A1* | 12/2005 | Batchelor | ............... | G01R 31/2815 |
| | | | | 370/241 |
| 2006/0184835 A1* | 8/2006 | Al-Omari | ............... | G06F 11/2268 |
| | | | | 714/45 |
| 2006/0255973 A1* | 11/2006 | Swoboda | ............... | G06F 11/3636 |
| | | | | 341/50 |
| 2008/0080651 A1* | 4/2008 | Edgar | ............... | G06F 11/3636 |
| | | | | 375/356 |
| 2008/0120523 A1* | 5/2008 | Cox | ............... | G06F 11/3636 |
| | | | | 714/45 |
| 2009/0089626 A1* | 4/2009 | Gotch | ............... | G06F 11/3476 |
| | | | | 714/45 |
| 2009/0187747 A1* | 7/2009 | Mayer | ............... | G06F 11/3636 |
| | | | | 712/227 |
| 2009/0217012 A1* | 8/2009 | West, Jr. | ............... | G06F 11/3466 |
| | | | | 712/227 |
| 2009/0228736 A1 | 9/2009 | Hendrickson et al. | | |
| 2009/0310667 A1 | 12/2009 | Lee et al. | | |
| 2010/0070805 A1* | 3/2010 | Chang | ............... | G06F 11/3688 |
| | | | | 714/39 |
| 2010/0299668 A1* | 11/2010 | Venkumahanti | ............... | G06F 11/3632 |
| | | | | 718/102 |
| 2010/0332909 A1* | 12/2010 | Larson | ............... | G06F 11/3476 |
| | | | | 714/40 |
| 2011/0099407 A1* | 4/2011 | Jonas | ............... | H03K 19/17744 |
| | | | | 713/400 |
| 2011/0242045 A1* | 10/2011 | Park | ............... | G06F 3/0418 |
| | | | | 345/174 |
| 2012/0030520 A1* | 2/2012 | Horley | ............... | G06F 11/3476 |
| | | | | 714/45 |
| 2012/0053924 A1 | 3/2012 | Wang et al. | | |
| 2014/0095846 A1* | 4/2014 | Mayer | ............... | G06F 11/3476 |
| | | | | 712/227 |

OTHER PUBLICATIONS

Ishwar Parulkar et al., "Comprehensive Approach to High-Performance Server Chipset Debug", IEEE Design & Test of Computers, May/Jun. 2009, pp. 70-77.

* cited by examiner

LOGIC CIRCUIT FOR THE GATHERING OF TRACE DATA

FIELD OF DISCLOSURE

The claimed subject matter relates generally to logic circuits and particularly relates to logic circuits for obtaining trace data in integrated circuits.

BACKGROUND

A conventional integrated circuit (IC), such as an application specific integrated circuit (ASIC), is typically divided into different functional logic units known as islands. Each island implements a specific function of the IC, such as direct memory access (DMA) transfer or data compression, for example. A typical IC also contains dedicated circuitry for collecting and outputting diagnostic information, so that the internal state of the IC can be determined during test or failure analysis. Such circuitry is typically referred to as a trace gathering logic unit or trace gathering island. Trace data from each island is typically transported along an n-bit bus and fed into a multiplexor. An internal trace select register connected to control inputs of the multiplexor selects which island's trace data is to be forwarded to the trace gathering island via a further n bit bus. The trace gathering island 30 then records the incoming trace data by latching it into registers on every clock cycle, from there, the trace data can be stored in a buffer to be analyzed later.

SUMMARY

Provided are techniques for implementing a logic circuit that includes a plurality of functional logic units each having an independent clock signal and each having a trace bus for carrying trace data; a trace gathering logic unit for collecting trace data from the functional logic units, the trace gathering logic unit having a clock signal independent of the clock signals of the functional logic units and a trace bus for receiving trace data from the functional logic units; multiplexing logic for multiplexing portions of trace data from different functional logic units onto the trace bus of the trace gathering logic unit; and, synchronization logic coupled to the multiplexing logic for communicating trace data from the functional logic units to the trace gathering logic unit based on the clock signal of the trace gathering logic unit, the synchronization logic comprising detection logic for determining when valid trace data from the functional logic units is available for placing on the trace bus of the trace gathering logic unit, and signalling logic coupled to the detection logic for signalling to the trace gathering logic unit that valid trace data is on the trace bus.

This summary is not intended as a comprehensive description of the claimed subject matter but, rather, is intended to provide a brief overview of some of the functionality associated therewith. Other systems, methods, functionality, features and advantages of the claimed subject matter will be or will become apparent to one with skill in the art upon examination of the following figures and detailed description.

BRIEF DESCRIPTION OF THE DRAWINGS

Preferred embodiments of the present invention will now be described by way of example only, with reference to the accompanying drawings, in which.

DETAILED DESCRIPTION

The disclosed technology addresses problems associated with combining trace data from two or more asynchronous islands by providing a signal that indicates to the trace gathering island when all segments of the trace bus contain valid trace data. The trace gathering island latches the data on the trace bus into its registers on assertion of this signal. An advantage of this system over conventional solutions is that it can be used to collect trace data from different islands each utilizing a different clock domain. Each such clock domain may be asynchronous to the clock, domains of other islands. Another advantage of this system is that the corresponding trace gathering island can be relatively simple. Specifically, in this system, the trace gathering island can be run off a clock, domain pre-existing in the IC or from a synchronous derivative thereof. Extra circuitry for a dedicated asynchronous clock domain is not needed.

What follows is a description of the simultaneous tracing of two islands each running off a different clock domain. It will be appreciated however that the disclosed technology is equally applicable to the simultaneous tracing of more than two islands.

Figure 1:
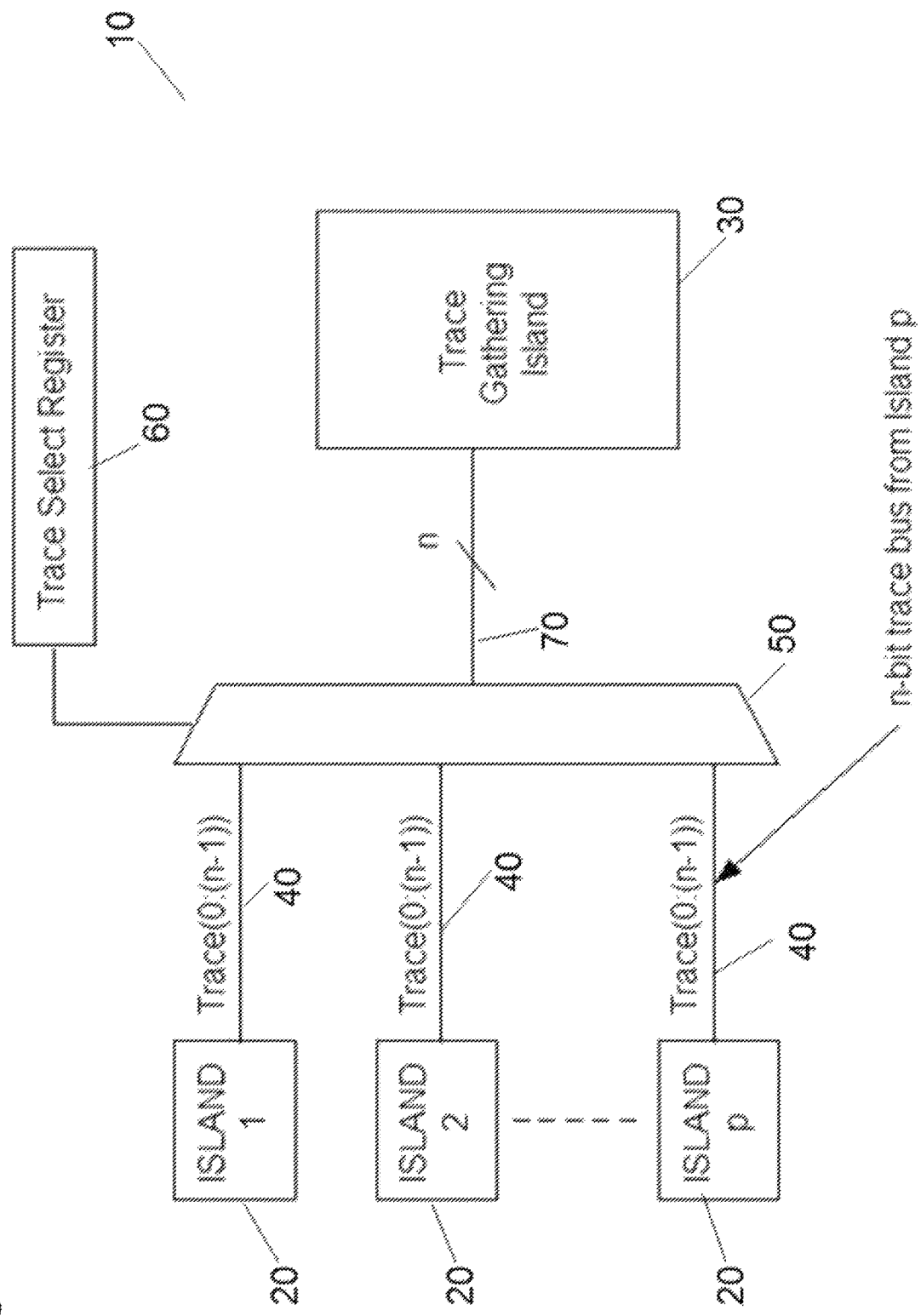
FIG. 1 is a block diagram of a conventional logic circuit for obtaining trace data in an IC.

Referring to FIG. 1, a conventional integrated circuit (IC) 10, such as an application specific integrated circuit (ASIC), is typically divided into different functional logic units known as islands 20. Each island 20 implements a specific function of the IC, such as direct memory access (DMA) transfer or data compression, for example. A typical IC also contains dedicated circuitry for collecting and outputting diagnostic information, so that the internal state of the IC can be determined during test or failure analysis. Such circuitry is typically referred to as a trace gathering logic unit or trace gathering island 30. Trace data from each island is typically transported along an n-bit bus 40, as shown in FIG. 1, and fed into a multiplexor 50. An internal trace select register 60 connected to control inputs of the multiplexor 50 selects which island's trace data is to be forwarded to the trace gathering island 30 via a further n bit bus 70. The trace gathering island 30 then records the incoming trace data by latching it into registers on every clock cycle. From there, the trace data can be stored in a buffer to be analyzed later.

Figure 2:
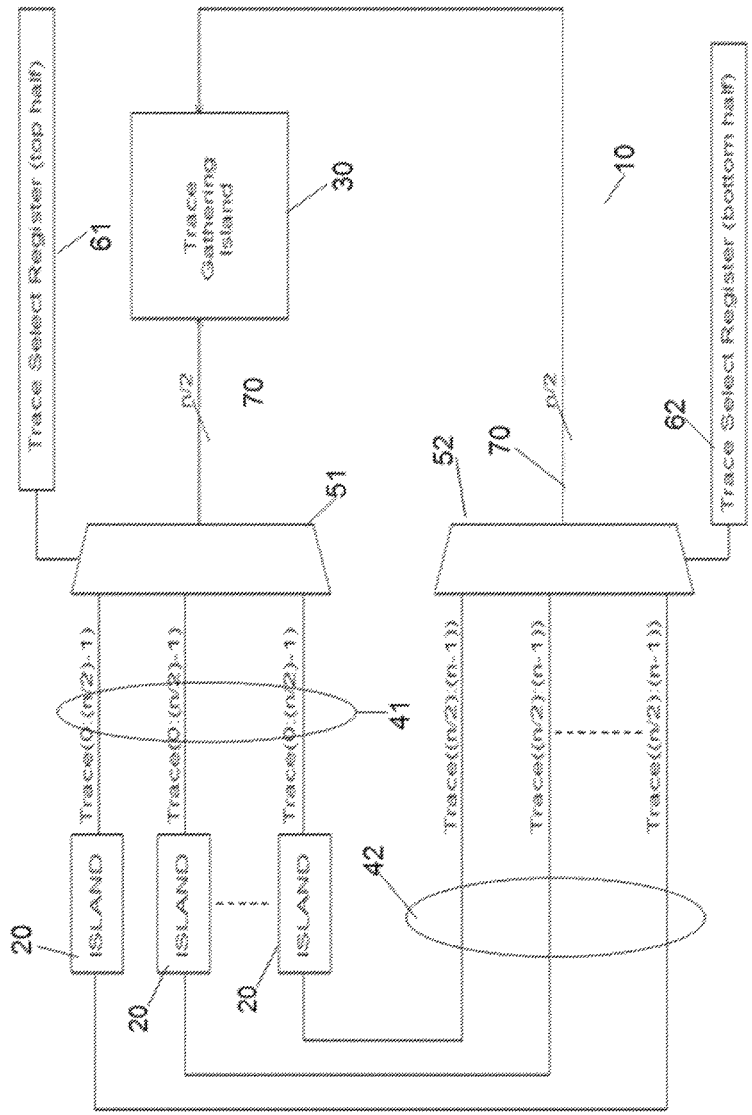
FIG. 2 is a block diagram block diagram of another conventional logic circuit for obtaining trace data in an IC; and, FIG. 3 is a block diagram block diagram of an example of a logic circuit for obtaining trace data in an IC in accordance with the present invention.

In some instances, it is useful to simultaneously collect trace data from multiple islands. FIG. 2 shows an arrangement in which two islands can be traced simultaneously whilst maintaining collection of the same amount of trace data: n bits per clock cycle. Bits 0 to ((n/2)−1) of the n-bit bus 41 from each island 20 is fed into a first multiplexor 51 whilst the other half (bits (n/2) to (n−1)) of the n-bit bus 42 from each island are fed into a second multiplexor 52. A first internal trace select register 61 is connected to control inputs of the first multiplexor 51. Similarly, a second internal trace select register 62 is connected to control inputs of the second multiplexor 52. The output of the first multiplexor 51 is controlled by the first trace select register 61. Likewise, the output of the second multiplexor 52 is controlled by the second trace select register 62. Half of the bus 70 is connected to the output of the first multiplexor 51. The other half of the bus 70 is connected to the output of the second multiplexor 52.

If the two islands 20 selected for tracing utilize the same clock, then trace data in both halves of the bus 70 is valid and may be latched on every clock cycle. However, the selected islands 20 may run at different clock speeds. Those clock domains are not necessarily synchronized to each other. If the selected islands run on asynchronous clock domains, men, at any time, irrespective of which of the two clocks is selected to latch the bus 70, half the bus may be in transition, and therefore invalid. This leads to inaccurate sampling of trace data. (Note that in conventional ASICs, it is usual for all logic in any single island to run synchronously).

A conventional solution to the aforesaid problem is to design the IC 10 such that all clock domains are synchronized. This may be viable for some applications. However, it is impractical for most applications. ASICS typically have a core clock frequency. Many ASICs employ memory interfaces having clock frequencies that are not wholly divisible by the core frequency. For example, an ASIC may have a core frequency at 800 MHz and yet have a memory interface operating at 1333 MHz.

Another conventional solution is to design the trace gathering island 30 to take samples based on its own clock running at a frequency of at least double that of the clock domain of any island 20 to be traced. A disadvantage with this solution is that the trace gathering island 30 then needs its own clock and accompanying circuitry, thereby increasing circuit complexity and real estate demands in the IC 10 to cater for logic that is only to be used for diagnostic purposes. Such resources may be more preferably utilized on the integrating of additional function into the ASIC. It would be preferable to provide a trace gathering island that uses a pre-existing clock domain of the ASIC, rather than specially create one.

In accordance with the present invention, there is now provided a logic circuit comprising: a plurality of functional logic units each having an independent clock signal and each having a trace bus for carrying trace data; a trace gathering logic unit for collecting trace data from the functional logic units, the trace gathering logic unit, having a clock signal independent of the clock signals of the functional logic units and a trace bus for receiving trace data from the functional logic units; multiplexing logic for multiplexing portions of trace data from different functional logic units onto the trace bus of the trace gathering logic unit; and, synchronization logic coupled to the multiplexing logic for communicating trace data from the functional logic units to the trace gathering logic unit based on the clock signal of the trace gathering logic unit, the synchronization logic comprising detection logic for determining when valid trace data from the functional logic-units is available for placing on the trace bus of the trace gathering logic unit, and signaling logic coupled to the detection logic for signaling to the trace gathering logic unit that valid trace data is on the trace bus.

In operation, the multiplexing logic preferably multiplexes trace data from plural functional logic units onto the trace bus of the trace gathering logic unit simultaneously. More specifically, in a preferred embodiment of the present invention, the multiplexing logic multiplexes trace data from two functional logic units onto different halves of the trace bus of the trace gathering logic unit simultaneously. The synchronization logic preferably comprises storage for temporarily storing trace data from one of the functional logic units pending availability of trace data from another of the functional logic units. The multiplexing logic is preferably coupled to the storage to selectively place combinations of current and stored trace data on the trace bus of the trace gathering unit in dependence on control signals from the detection logic. It will be appreciated that the present invention extends to an integrated circuit comprising a such a logic circuit.

Viewing the disclosed technology from another aspect there is now provided techniques for collecting trace data from, a plurality of functional logic units in a logic circuit, each functional logic unit having an independent clock signal and a trace bus for carrying trace data, the method comprising: providing a trace gathering logic unit for collecting trace data from the functional logic units, the trace gathering logic unit having a clock signal independent of clock signals of the functional logic units and a trace bus for receiving trace data from the functional logic units; multiplexing portions of trace data from different functional logic units onto the trace bus of the trace gathering logic unit via multiplexing logic; communicating, via synchronization logic coupled to the multiplexing logic, trace data from the functional logic units to the trace gathering logic unit based on the clock signal of the trace gathering logic unit; determining, via detection logic of the synchronization logic, when valid trace data from the functional logic units is available for placing on the trace bus of the trace gathering logic unit; and, signaling to the trace gathering logic unit, via signaling logic of the synchronization logic, which signaling logic is coupled to the detection logic, that valid trace data is on the trace bus.

Figure 3:
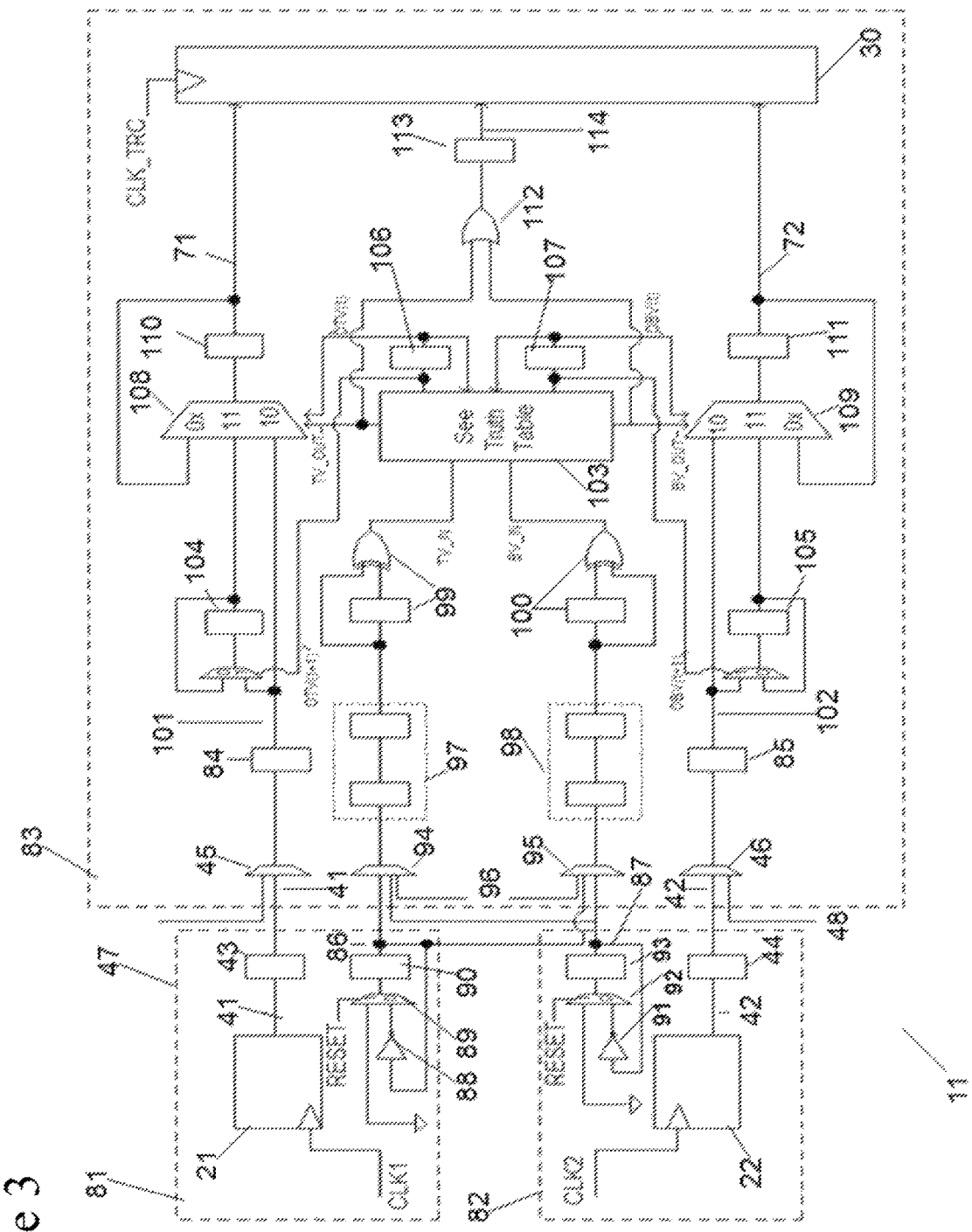

Referring to FIG. 3, in a preferred embodiment of the present invention, there is provided an IC 11 comprising a plurality of islands 20 and trace gathering logic for selectively coupling trace data from the islands 20 to a trace gathering island 30. By way of exemplary explanation only, suppose that two of the islands 21 and 22 are selected to be traced by the trace gathering island 30. Island 21 has an n-bit trace bus 41. Likewise, island 22 has an n-bit trace bus 42. The trace gathering island 30 also has an n-bit trace bus connected thereto having two trace bus halves, 71 and 72. Trace bus 41 is fed to latching register 43. Likewise, trace bus 42 is fed to latching register 44. Half of trace bus 41 emerging from register 43, trace half bus 41', is to be multiplexed onto trace half bus 71. Similarly, half of trace bus 42 emerging from register 44, trace half bus 42', is to be multiplexed onto trace half bus 72.

Islands 21 and 22 operate using clocks CLK1 and CLK2 respectively. Clocks CLK1 and CLK2 may be asynchronous relative to each other and also to the clock with which the trace gathering island 30 operates, CLK_TRC. Island 21 and associated portions of the trace gathering logic reside in a CLK1 clock domain 81. Island 22 and associated portions of the trace gathering logic reside in a CLK2 clock domain 82. The trace gathering island 30 and associated portions of the trace gathering logic reside in a CLK_TRC clock domain 83

Before trace bus 41 is passed to clock domain 83, it is clocked through register 43 by the CLK1 clock signal. Similarly, before trace bus 42 is passed to the clock domain, it is clocked through register 44 by the CLK2 clock signal. Similar registers are present in other islands 20 on the IC 11. Trace half bus 41' is fed to inputs of a multiplexor 45. Similarly, trace half bus 42' is fed to inputs of a multiplexor 46. Register outputs of islands 20 other than island 21 are also connected to inputs of multiplexer 45. These are collectively denoted by numeral 47. Similarly, register outputs of islands 20 other than island 22 are also connected to inputs of multiplexer 46. These are collectively denoted by numeral 48. The output of multiplexor 45 is clocked through a register 84 by the CLK_TRC clock signal. Similarly, the output of multiplexor 46 is clocked through a register 85 by the CLK_TRC clock signal. The outputs of multiplexors 45 and 46 are thereby synchronised into clock domain 83. The outputs of registers 84 and 85 will hereinafter be referred to as the top half bus 101 and the bottom half bus 102 respectively.

An inverter 88, multiplexor 89, and register 90 in clock domain 81 are interconnected so as to produce a toggle signal 86 which toggles on every cycle of clock signal CLK1. Similarly, an inverter 91, multiplexor 92, and register 93 in clock domain 82 are interconnected so as to produce a toggle signal 87 which toggles on every cycle of clock signal CLK2. Toggle signals 86 and 87 are each fed into a pair of multiplexors 94 and 95. Multiplexor 94 corresponds to one half of the trace data and multiplexor 95 corresponds to the other half of the trace data. Toggle signals from other islands are also connected to multiplexors 94 and 95, as collectively denoted by numeral 96. The output of multiplexor 94 is connected to a double latch 97. Similarly, the output of multiplexor 95 is connected to a double latch 98. Double latches 97 and 98 are each clocked by the CLK_TRC clock signal. Double latches 97 and 98 thus synchronise the output of multiplexors 94 and 95 to the CLK_TRC domain. The outputs of multiplexors 94 and 95 will hereinafter be referred to as the top and bottom half toggle signals.

The top half toggle signal emerges from double latch 97 into an XOR gate/latch circuit 99 which, in turn, produces a TV_IN ("Top Valid IN") signal. Similarly, the bottom half toggle signal emerges from double latch 98 into an XOR gate/latch circuit 100 which, in turn, produces a BV_IN ("Bottom Valid IN") signal. The TV_IN and BV_IN signals respectively indicate when the top and bottom half buses 101 and 102 are valid in the CLK_TRC domain. The TV_IN and BV_IN signals are fed into combinatorial logic 103. In operation, logic 103 determines when to indicate to the trace gathering island 30 that there is valid trace data available on the top and bottom half buses 101 and 102. Additionally, in operation, logic 103 ensures that any valid trace data on one of the top and bottom half bases 101 and 102 is stored until there is also valid trace data available on the other of the top and bottom half buses 101 and 102. In this regard, register 104 stores trace data on the output of register 84 and register 105 stores trace data on the output of register 85.

The outputs of logic 103 include:

TV_OUT ("Top Valid OUT")—Indicates that valid trace data on top half bus 101 can be presented via top trace half bus 71 to trace gathering island 30;

BV_OUT ("Bottom Valid OUT")—Indicates that valid trace data on bottom half bus 102 can be presented via bottom trace half bus 72 to trace gathering island 30;

OTV(t) ("Old Fop Valid" at cycle t)—Emerges from logic 103 via a latch 106 and indicates that previously valid data is already stored in register 104;

OTV(t+1)—(Value of OTV(t) for the next cycle and the input to latch 106 for OTV(t))—Indicates that trace data on top half bus 101 should be stored in register 104;

OBV(t) ("Old Bottom Valid" at cycle t)—Emerges from logic 103 via latch 107; indicates that previously valid data is already stored in register 105; and, OBV(t+1) (Value of OBV(t) for the next cycle and the input to latch 107 for OBV(t))—indicates that trace data on bottom half bus 102 should be stored in register 105.

The truth table for logic 103 is as follows:

| Inputs | | | | Outputs | | | | |
|---|---|---|---|---|---|---|---|---|
| TV_IN | BV_IN | OTV(t) | OBV(t) | OTV(t + 1) | OBV(t + 1) | TV_OUT | BV_OUT | Comments |
| 0 | 0 | x | x | OTV(t) | OBV(t) | 0 | 0 | A |
| 1 | 0 | 0 | 0 | 1 | 0 | 0 | 0 | B |
| 1 | 0 | 1 | 0 | 1 | 0 | 1 | 0 | C |
| 1 | 0 | 0 | 1 | 0 | 0 | 1 | 1 | D |
| 1 | 0 | 1 | 1 | x | x | x | x | E |
| 0 | 1 | 0 | 0 | 0 | 1 | 0 | 0 | F |
| 0 | 1 | 1 | 0 | 0 | 0 | 1 | 1 | G |
| 0 | 1 | 0 | 1 | 0 | 1 | 0 | 1 | H |
| 0 | 1 | 1 | 1 | x | x | x | x | I |
| 1 | 1 | 0 | 0 | 0 | 0 | 1 | 1 | J |
| 1 | 1 | 0 | 1 | 0 | 1 | 1 | 1 | K |
| 1 | 1 | 1 | 0 | 1 | 0 | 1 | 1 | L |
| 1 | 1 | 1 | 1 | x | x | x | x | M |

What follows are comments A to M associated with the final column of the truth table.

A: No valid trace data on top and bottom half buses 101 and 102. Do nothing.

B: New valid trace data on top half bus 101 but not on bottom half bus 102. Store output of register 84 in register 104.

C: New valid trace data on top half bus 101 and previous trace data already stored in register 104. Present output of register 104 to top half bus 71 via multiplexor 108 and register 110 and store new trace data in register 104. Bottom half bus 72 is set to whatever was previously stored on register 111.

D: New valid trace data on top half bus 101 and previous trace data already stored in register 105. Present both to trace gathering island 30 via multiplexors 108 and 109, registers 110 and 111, and top and bottom half buses 71 and 72.

E: Don't care. This state is not possible (see note below).

F: New valid trace data on bottom half bus 102 but not on top half bus 101. Store output of register 85 in register 105.

G: New valid trace data on bottom half bus 102 and previous trace data already stored in register 104. Present both to trace gathering island 30 via multiplexors 108 and 109, registers 110 and 111, and top and bottom half buses 71 and 72.

H: New valid trace data on bottom half bus 102 and previous trace data already stored in register 105. Present output of register 105 to trace gathering island 30 via multiplexor 109, register 111, and bottom half bus 72, and store output of register 85 in register 105. Top half bus 71 is set to whatever was previously stored on register 110.

I: Don't care. This state not possible (see below).

J: New valid trace data on top and bottom half buses 101 and 102. Present both to trace gathering island 30 via multiplexors 108 and 109, registers 110 and 111, and top and bottom half buses 71 and 72.

K: New valid trace data on top and bottom half buses 101 and 102, and previous trace data already stored in register 105. Present new trace data on top half bus 101 and previous trace data stored in register 105 to trace gathering island 30 via multiplexors 108 and 109, registers 110 and 111, and top and bottom half buses 71 and 72. Store new trace data on bottom half bus 102 in register 105.

L: New valid trace data on top and bottom half buses 101 and 102, and previous trace data already stored in register 104. Present new trace data on bottom half bus 102 and previous trace data stored in register 104 to trace gathering island 30 via multiplexors 108 and 109, registers 110 and 111, and top and bottom half buses 71 and 72. Store new trace data on top half bus 101 in register 104.

M: Don't care. This state is impossible (see below).

Note that states where OTV(t) and OBV(t) are both high are not possible. As an example, suppose OBV(t) was already set (indicating that previous trace data is stored in register 105) when TV_IN is 1b (indicating new valid trace data is on the top half bus 101) and BV_IN is 0b, then the new trace data on the top half bus 101 and the previous trace data in the register 105 will be forwarded to the trace gathering island 30. Latch 106 will not get set and latch 107 will be reset at the next cycle. Vice versa for the case when latch 106 is already set.

As indicated above, the trace data applied to top half bus 71 is determined by multiplexor 108 based on the values of TV_OUT and OTV(t), and the trace data applied to bottom half bus 72 is determined by multiplexor 109 based on the values of BV_OUT and OBV(t). When TV_OUT=0b, there is no update to top half bus 71. Instead, previous trace data stored in register 110 is presented on top half bus 71. When TV_OUT=1b and OTV(t)=0b, the trace data on top half bus 101, synchronised to the CLK_TRC domain 83, is presented on top half bus 71. When TV_OUT=1b and OTV(t)=1b, previous data stored in register 104 should be presented on top half bus 71 ahead of the current trace data on top half bus 101 to preserve the correct order of presentation. It will be appreciated the multiplexor 109, together with registers 105 and 111, provide similar functionality relative to the bottom half bus 72.

TV_OUT and BV_OUT are processed by OR gate 112. The output of OR gate 112 is sent through a latch 113 to produce signal 114 that indicates to the trace gathering island 30 that the top and bottom half buses 71 and 72 are together valid.

In operation, after either the IC 11 is turned on or reset, it is preferable to allow sufficient time for the valid trace data to have arrived on both the top and bottom half buses 71 and 72 before the trace gathering island 30 begins to accept trace data or otherwise records trace data as valid. The signal 114 facilitates this wait state. The duration of the wait state is preferably set as a function of the frequency and phase relationships between the clock frequencies associated with the islands 20 to be traced. In an improvement to the preferred embodiment of the present invention hereinbefore described with reference to FIG. 3, the signal 114, is prevented from being asserted until valid trace data is present on both half buses 71 and 72. It should be noted that IC initialisation sequences usually allow enough time for the IC to settle before being given work to do. It will also be appreciated that registers 21 and 22 may be enlarged to hold more than one previous set of trace bus values.

In the examples of the present invention hereinbefore described, trace data from two different functional logic units is multiplexed onto different halves of the trace bus of the trace gathering logic unit simultaneously. It will be appreciated that, that in other embodiments of the present invention, different fractional multiplexing schemes may be employed, so that trace data from more than two different functional logic units is simultaneously multiplexed onto the trace bus of the trace gathering logic unit.

We claim:

1. A logic circuit comprising:
a plurality of functional logic units each having an independent clock signal and each having a trace bus for carrying trace data, wherein each trace bus is comprised of at least two parallel portions and the corresponding trace data is apportioned among the at least two portions of trace data;
a trace gathering logic unit for simultaneously collecting trace data from the functional logic units, the trace gathering logic unit having a clock signal independent of the clock signals of the functional logic units and a trace bus for receiving trace data from the functional logic units;
multiplexing logic for multiplexing the at least two portions of trace data from different functional logic units onto the trace bus of the trace gathering logic unit; and,
synchronization logic coupled to the multiplexing logic for communicating trace data from the functional logic units to the trace gathering logic unit based on the clock signal of the trace gathering logic unit, the synchronization logic comprising detection logic for determining when valid trace data from the functional logic units is available for placing on the trace bus of the trace gathering logic unit, and signalling logic coupled to the detection logic for signalling to the trace gathering logic unit that valid trace data is on the trace bus.

2. The logic circuit of claim 1, wherein, in operation, the multiplexing logic multiplexes trace data from plural functional logic units onto the trace bus of the trace gathering logic unit simultaneously.

3. The logic circuit of claim 2, wherein, in operation, the multiplexing logic multiplexes trace data from two functional logic units onto different halves of the trace bus of the trace gathering logic unit simultaneously.

4. The logic circuit of claim 1, wherein the synchronization logic comprises storage for temporarily storing trace data from one of the functional logic units pending availability of trace data from another of the functional logic units.

5. The logic circuit of claim 4, wherein the multiplexing logic is coupled to the storage to selectively place combinations of current and stored trace data on the trace bus of the trace gathering unit in dependence on control signals from the detection logic.

6. The logic circuit of claim 1, wherein the logic circuit is an integrated circuit.

7. A method for collecting trace data from a plurality of functional logic units in a logic circuit, each functional logic unit having an independent clock signal and a trace bus for carrying trace data, wherein each trace bus is comprised of at least two parallel portions and the corresponding trace data is apportioned among the at least two portions of trace data, the method comprising:
providing a trace gathering logic unit for simultaneously collecting trace data from the functional logic units, the trace gathering logic unit having a clock signal independent of clock signals of the functional logic units and a trace bus for receiving trace data from the functional logic units;

multiplexing the at least two portions of trace data from different functional logic units onto the trace bus of the trace gathering logic unit via multiplexing logic;

communicating, via synchronization logic coupled to the multiplexing logic, trace data from the functional logic units to the trace gathering logic unit based on the clock signal of the trace gathering logic unit;

determining, via detection logic of the synchronization logic, when valid trace data from the functional logic units is available for placing on the trace bus of the trace gathering logic unit; and, signalling to the trace gathering logic unit, via signalling logic of the synchronization logic, which signalling logic is coupled to the detection logic, that valid trace data is on the trace bus.

8. The method of claim 7, wherein the multiplexing comprises multiplexing trace data from plural functional logic units onto the trace bus of the trace gathering logic unit simultaneously.

9. The method of claim 7, wherein the multiplexing comprises multiplexing trace data from two functional logic units onto different halves of the trace bus of the trace gathering logic unit simultaneously.

10. The method of claim 7, further comprising temporarily storing trace data from one of the functional logic units pending availability of trace data from another of the functional logic units.

11. The method of 10, further comprising selectively placing combinations of current and stored trace data on the trace bus of the trace gathering unit in dependence on control signals from the detection logic.

12. A computer programming product for collecting trace data from a plurality of functional logic units in a logic circuit, each functional logic unit having an independent clock signal and a trace bus for carrying trace data, wherein each trace bus is comprised of at least two parallel portions and the corresponding trace data is apportioned among the at least two portions of trace data, the method comprising:

a processor, a non-transitory memory coupled to the processor; and logic, stored on the memory for execution on the processor for:

providing a trace gathering logic unit for simultaneously collecting trace data from the functional logic units, the trace gathering logic unit having a clock signal independent of clock signals of the functional logic units and a trace bus for receiving trace data from the functional logic units;

multiplexing the at least two portions of trace data from different functional logic units onto the trace bus of the trace gathering logic unit via multiplexing logic;

communicating, via synchronization logic coupled to the multiplexing logic, trace data from the functional logic units to the trace gathering logic unit based on the clock signal of the trace gathering logic unit;

determining, via detection logic of the synchronization logic, when valid trace data from the functional logic units is available for placing on the trace bus of the trace gathering logic unit; and, signalling to the trace gathering logic unit, via signalling logic of the synchronization logic, which signalling logic is coupled to the detection logic, that valid trace data is on the trace bus.

13. The computer programming product of claim 12, wherein the multiplexing logic comprises logic for multiplexing trace data from plural functional logic units onto the trace bus of the trace gathering logic unit simultaneously.

14. The computer programming product of claim 12, wherein the multiplexing logic comprises logic for multiplexing trace data from two functional logic units onto different halves of the trace bus of the trace gathering logic unit simultaneously.

15. The computer programming product of claim 12, further comprising logic for temporarily storing trace data from one of the functional logic units pending availability of trace data from another of the functional logic units.

16. The computer programming product of claim 10, further comprising logic for selectively placing combinations of current and stored trace data on the trace bus of the trace gathering unit in dependence on control signals from the detection logic.

* * * * *